United States Patent
Kessel (10) Patent No.: US 9,780,814 B2
(45) Date of Patent: Oct. 3, 2017

(54) GAIN CONTROL APPARATUS

(71) Applicant: NXP B.V.

(72) Inventor: Martin Kessel, Dresden (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/239,558

(22) Filed: Aug. 17, 2016

(65) Prior Publication Data

US 2017/0054458 A1 Feb. 23, 2017

(30) Foreign Application Priority Data

Aug. 17, 2015 (EP) ..................................... 15181263

(51) Int. Cl.
| | |
|---|---|
| *H04B 1/04* | (2006.01) |
| *H03G 3/30* | (2006.01) |
| *H03G 7/00* | (2006.01) |
| *H01Q 7/00* | (2006.01) |

(52) U.S. Cl.
CPC ............. *H04B 1/0475* (2013.01); *H01Q 7/00* (2013.01); *H03G 3/3052* (2013.01); *H03G 7/002* (2013.01); *H04B 2001/0416* (2013.01)

(58) Field of Classification Search
CPC .......... H03G 3/301; H03G 3/001; H03G 3/20; H03G 3/3005
See application file for complete search history.

(56) References Cited

U.S. PATENT DOCUMENTS

| | | | |
|---|---|---|---|
| 4,996,712 A | 2/1991 | Laurence et al. | |
| 5,930,693 A | 7/1999 | Kennedy et al. | |
| 2001/0055350 A1 | 12/2001 | Higure | |
| 2006/0017501 A1 | 1/2006 | Nodake | |
| 2006/0217059 A1* | 9/2006 | Takano | H04H 20/02 455/3.02 |
| 2008/0212167 A1* | 9/2008 | Van Schyndel | H04B 10/2935 359/341.41 |
| 2008/0253586 A1 | 10/2008 | Wei | |
| 2008/0292032 A1 | 11/2008 | Belogolovy et al. | |
| 2010/0085117 A1 | 4/2010 | Moon et al. | |
| 2010/0150379 A1* | 6/2010 | Craig | H03G 3/20 381/108 |

OTHER PUBLICATIONS

Sykes, F. E. et al. "A BiFET automatic gain control amplifier for hearing aids", Proceed. of the IEEE Custom Integrated Circuits Conference, pp. 299-302 (1996).
Extended European Search Report for Patent Appln. No. 15181263.3 (dated Jun. 16, 2016).

* cited by examiner

*Primary Examiner* — Vineeta Panwalkar
(74) *Attorney, Agent, or Firm* — Rajeev Madnawat (57) ABSTRACT

A gain control apparatus for an amplifier is disclosed. The gain control apparatus configured to provide an amplifier gain control signal for setting the gain applied by the amplifier to an amplifier signal comprising an amplifier input signal amplified by the amplifier to generate an amplifier output signal. The apparatus includes a plurality of gain determination elements comprising and a gain controller configured to generate the amplifier gain control signal based on at least the first and second gain control signals.

20 Claims, 2 Drawing Sheets

GAIN CONTROL APPARATUS

CROSS-REFERENCE TO RELATED APPLICATIONS

This application claims the priority under 35 U.S.C. §119 of European Patent application no. 15181263.3, filed on Aug. 17, 2015, the contents of which are incorporated by reference herein.

The present disclosure relates to automatic gain control apparatus for a controllable amplifier or attenuator. It also relates to an amplifier or attenuator in combination with such an automatic gain control apparatus. It also relates to an electronic device, such as a receiver, including the above combination.

According to a first aspect of the present disclosure there is provided a gain control apparatus for an amplifier, the gain control apparatus configured to provide an amplifier gain control signal for setting the gain applied by the amplifier to an amplifier signal comprising an amplifier input signal amplified by the amplifier to generate an amplifier output signal, the apparatus comprising;
 a plurality of gain determination elements comprising, at least;
  a first gain determination element configured to receive an input signal derived from the amplifier signal and determine a first gain control signal therefrom based on changes in the input signal; and
  a second gain determination element configured to receive an input signal derived from the amplifier signal and determine a second gain control signal therefrom based on changes in the input signal; and
  wherein the first gain determination element is configured to react to changes in the input signal faster than the second gain determination element and/or the first gain determination element is configured to map the change in input signal to its first gain control signal differently to the way the second gain determination element maps the change in input signal to its second gain control signal;
 a gain controller configured to generate the amplifier gain control signal based on at least the first and second gain control signals.

In one or more embodiments one or more of the gain determination elements are configured to receive an indication of a power level of the amplifier input or amplifier output signal as their input signal.

In one or more embodiments the input signal comprises the amplifier input signal or the amplifier output signal. In one or more embodiments the apparatus includes a power level determination element configured to receive the amplifier output signal and generate a power level signal indicative of the power of the amplifier output signal for providing to the gain determination elements. Alternatively it may generate a power level indicative of the power of the amplifier input signal.

In one or more embodiments the first and second gain determination elements comprise closed loop feedback elements configured to react to changes in the input signal at different speeds. Thus, the at least two gain determination elements may map their gain control signals in the same way but react at different speeds to changes in the input signal. Alternatively, they may react at the same speed but the gain control signal provided may be mapped from the input signal differently.

In one or more embodiments the gain controller is configured to select one of the gain control signals from the plurality of gain determination elements as the amplifier gain control signal based on predetermined criteria.

In one or more embodiments the criteria comprise selection of a lower of the gain control signals from the plurality of gain determination elements.

In one or more embodiments the apparatus is configured to use a historic amplifier gain control signal, obtained within a predetermined time of a current time, in determination of the amplifier gain control signal. This may be useful when short term noise is encountered to ensure that once the noise has passed, the amplifier gain control signal returns to an appropriate value, such as a value based on or comprising the historic amplifier gain control signal.

In one or more embodiments the apparatus is configured to use the historic amplifier gain control signal in determination of a current amplifier gain control signal, the historical amplifier gain control signal obtained at least prior to an abrupt change in the gain control signal comprising a change that exceeds a rate of change threshold, the historical amplifier gain control signal used in the determination of a current amplifier gain control signal once the input signal or a signal derived therefrom substantially returns to a value prior to the abrupt change.

In one or more embodiments the gain controller is configured use the difference between the gain control signals of any two gain determination elements in generation of the amplifier gain control signal.

In one or more embodiments one or more of the gain determination elements are configured to receive a signal representative of the difference between the gain control signals of any two of the gain determination elements and use said signal in determining their gain control signal. For example, the gain determination elements may adjust their gain control signal if the difference is greater than a threshold amount or greater than a threshold amount for a predetermined time.

In one or more embodiments the predetermined criteria includes the number of times the gain control signal of one of the gain determination elements has been selected as the amplifier gain control signal in a predetermined preceding period.

In one or more embodiments the first gain determination element is configured to map the change in input signal to its first gain control signal using a first predetermined function and the second gain determination element is configured to map the change in input signal to its second gain control signal using a second predetermined function, the first function different to the second function. In one or more embodiments the first gain determination element is configured to linearly map the change in input signal to its first gain control signal and the second gain determination element is configured to non-linearly map the change in input signal to its second gain control signal. The non-linear map may comprise a quadratic map. In other examples, the different functions or maps may be configured such that over a subset of expected input signal changes, the first gain determination element provides a higher gain control signal and over a remaining subset of expected input signal changes, the second gain determination element provides a higher gain control signal. The first and second functions may be selected from linear function, quadratic function, exponential function, non-linear function, or any other function type. It will be appreciated that the functions may be based on a logarithmic measure of input signal power (dB) or non-logarithmic.

In one or more embodiments the apparatus includes at least one further gain determination element configured to receive an input signal derived from the amplifier output signal and determine a further gain control signal therefrom based on changes in the input signal, wherein the further gain determination element is configured to react to changes in the input signal at a different speed than the other gain determination elements and/or the further gain determination element is configured to map the change in input signal to its further gain control signal differently to the way the other gain determination elements map the change in input signal to their gain control signal.

In one or more embodiments the apparatus is configured to identify a pattern of interference in the amplifier signal using a pattern detection algorithm applied to interference events and determine a predicted future interference event using the pattern to enable the apparatus to generate an amplifier gain control signal to compensate for the predicted future interference event.

In one or more embodiments the gain controller is configured to select one of the gain control signals from the plurality of gain determination elements as the amplifier gain control signal based on predetermined criteria; and the apparatus is configured to determine an interference event using times when the first gain control signal is selected by the gain controller, the apparatus configured to use measured time periods between at least three consecutive selections of the first gain control signal as the amplifier gain control signal and if the selection of the first gain control system is periodic by virtue of the measured periods being substantially equal, the apparatus is configured to use the measured time period and a previous gain control signal determined during one of the previous interference events to determine the amplifier gain control signal.

Thus, the pattern detection algorithm may be configured to detect a repetition of interference in the input signal with a fixed period; or may be configured to detect alternating periods of interference (e.g. 2 ms, 3 ms, 2 ms, 3 ms, . . . ). Such patterns or more complex patterns can be detected by storing more time periods and looking for repetitions. In further examples, such as if the pattern is more complex (different overlapping periods), it may be advantageous to perform a Fourier analysis of the gain difference signal.

In one or more embodiments the apparatus is configured to use a measured duration of when the first gain control signal is selected to determine a predicted duration of a predicted future interference event and use the duration to determine the amplifier gain control signal.

According to a second aspect of the present disclosure there is provided an amplifier arrangement including a controllable amplifier or attenuator and the gain control apparatus according to the first aspect for providing the amplifier gain control signal to the controllable amplifier or attenuator.

According to a third aspect of the present disclosure there is provided a radio receiver including an antenna for receiving an input signal for amplification by the amplifier of the second aspect.

According to a fourth aspect of the present disclosure there is provided a method configured to provide an amplifier gain control signal for setting the gain applied by the amplifier to an amplifier signal comprising an amplifier input signal amplified by the amplifier to generate an amplifier output signal, the method comprising generating an amplifier gain control signal based on at least a first and a second gain control signal;

the first gain control signal determined using an input signal derived from the amplifier signal and determined based on changes in the input signal; and the second gain control signal determined using an input signal derived from the amplifier signal and determined based on changes in the input signal; wherein the first gain control signal is determined such that it reacts to changes in the input signal faster than the second gain control signal reacts to changes in the input signal and/or the first gain control signal is mapped from changes in the input signal differently to the way the second gain control signal is mapped from changes in input signal.

In one or more embodiments the difference in the reaction times is provided by at least two control loops that receives the input signal and generates its gain control signal based on changes in the input signal, the control loops configured to operate at different speeds.

According to a fifth aspect of the present disclosure there is provided a gain control apparatus for an amplifier arranged to operate in accordance with the method of the fourth aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Figure 1:
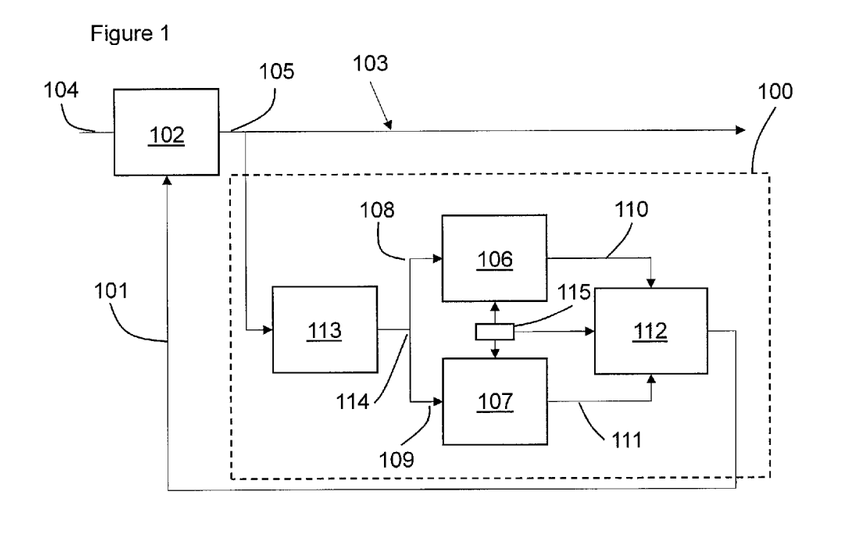
FIG. 1 shows an example of a gain control apparatus for an amplifier.
Figure 2:
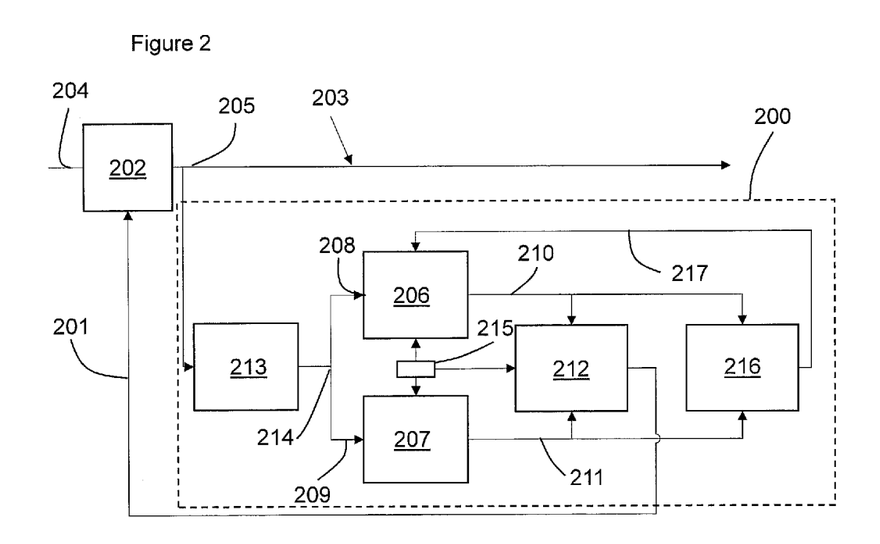
FIG. 2 shows a second example of a gain control apparatus for an amplifier.

The examples shown in FIGS. 1 and 2 comprise a gain control apparatus 100, 200 for providing a gain control signal 101, 201 to an amplifier 102, 202. The amplifier 102, 202 is configured to operate on an amplifier signal 103, 203. The amplifier signal comprises an amplifier input signal 104, 204 that is amplified by the amplifier 102, 202 to generate an amplifier output signal 105, 205. It will be appreciated that the amplifier 102, 202 may apply positive gain or negative gain and may thus be considered an attenuator in such circumstances. The following description will make reference hereinafter to an amplifier for brevity.

Automatic gain control is used to automatically modify the gain of an amplifier based on the strength of the signal amplified by the amplifier. The amplifier input signal may comprise a received signal, such as a wirelessly received signal, from an antenna or transmission medium. Accordingly, the received signal may include noise and the automatic gain control may be configured to improve the signal to noise ratio (SNR) of the received amplifier input signal.

The presence of impulse noise comprising fast appearing and disappearing, high signal strength, signals may make reception of the desired signal difficult. Impulse noise may be caused by devices that use Wireless Local Area Network (WLAN) communications or Long Term Evolution (LTE) communications. Such devices may be located in close proximity to a receiver, such as that for a Digital Audio Broadcasting (DAB) radio receiver, and may therefore make reception of the DAB signal difficult. In modern cars for example, there may be several electronic devices that by virtue of their operation, may generate signals considered to be noise and interference for other receivers therein.

In general, the aim of automatic gain control in a receiver is to maximize the signal-to-noise ratio and protect analogue components from stress. The maximum gain is limited by non-linearities of the amplifier/receiver tuner, e.g. voltage saturation or digital saturation because of the limited bit-width of a digital signal path.

Too fast tracking of changes in the received signal may lead to signal disturbance, due to following of the envelope of the signal (which may be a problem in Orthogonal Frequency Division Multiplexing (OFDM) systems). Further, analogue gain stages are prone to non-idealities, which may lead to an unexpected deviation in gain and phase of the signal during gain changes. Further, certain transmission schemes such as the DAB standard may include a "Null-Symbol", which is ~1.3 ms of silence instead of an ODFM signal, which may cause issues with fast tracking of changes in the received signal.

Slow tracking may require more back-off in the automatic gain control to avoid non-linearities in case the signal is rising faster than the gain control is reacting, which limits the effective SNR of the system and therefore the available performance. Further, if a strong signal is introduced into an analogue circuit it may damage or stress the device. Therefore it may be advantageous to use a controllable attenuator to protect analogue devices. It may be desirable to provide an automatic gain control with a fast reaction time (attack time) to address the stressing of analogue components.

Returning to FIGS. 1 and 2, the gain control apparatus 100, 200 comprises a plurality of gain determination elements 106, 206, 107, 207 comprising, at least a first gain determination element 106, 206 configured to receive an input signal 108, 208 derived from the amplifier signal 103 and a second gain determination element 107, 207 configured to receive an input signal 109, 209 derived from the amplifier signal 103. In this example, the input signals received by the gain determination elements comprises a common input signal. The first gain determination element 106, 206 is configured to determine a first gain control signal 110, 210 based on changes in the input signal 108. The second gain determination element 107, 207 is configured to determine a second gain control signal 111, 211 based on changes in the input signal. The first gain determination element 106, 206 is configured to have a fast reaction time to changes in the input signal to adjust the gain, i.e. a high attack time, while the second gain determination element 107, 207 is configured to have a slower reaction time to changes in the input signal to adjust the gain, i.e. a lower attack time. Accordingly, the first gain determination element may be configured to react to impulse noise and/or fast appearing/disappearing blocking signals. The second gain determination element may be configured to react to a longer term recent average of the input signal. The apparatus 100, 200 further comprises a gain controller 112, 212 configured to generate the amplifier gain control signal 101, 201 based on at least the first and second gain control signals 110, 111, 210, 211.

In addition or as an alternative the first gain determination element 107, 207 is configured to map the change in input signal to its first gain control signal differently to the way the second gain determination element maps the change in input signal to its second gain control signal. For example, a linear map, quadratic map, or any other function could be used provided it is different to the map/function used by the other gain determination element.

It will be appreciated that some or all of the apparatus 100, 200 such as the gain determination elements and gain controller may be implemented as separate logic or one or more discrete components as shown in FIGS. 1 and 2, or may be combined or may comprise a processor unit, hardware, firmware or software configured to provide the functionality of the above described elements. The representation of these elements in the Figures may or may not be indicative of their physical layout and is intended to represent one example of the functionality of the gain control apparatus.

The first and second gain determination elements 106, 206, 107, 207 may comprise closed loop feedback elements operating at frequencies related to the different first and second frequencies. The loops of the first and second gain determination element may thus operate with different time constants. The first gain determination element thus comprises a fast control loop configured to react to abrupt changes in the input signal while the second gain determination element comprises a slower control loop configured to provide a more steady gain control signal that is less influenced by impulse noise. In other examples, the first and second gain determination elements are embodied as a single control loop that is configured to provide multiple gain signals that represent the first and second gain control signals. The first and second gain determination elements 106, 206, 107, 207 may be implemented in analogue circuits or digitally and may process discrete or continuous amplifier signals. The difference between first and second elements is in how quickly and/or to what degree they react to changes in the amplifier signal.

The first and second gain determination elements 106, 206, 107, 207 may comprise substantially conventional automatic gain controllers that are configured to operate at different speeds and thus have different attack times. In other examples, the first and second gain determination elements 106, 206, 107, 207 may operate at the same speed, but the way they generate their gain control signal from their input signal may be different. For example, the one gain determination element may have a linear output and the other gain determination element may have a quadratic output. In that case it is possible that the "quadratic" element reacts slower in case there is a small input signal swing, but faster once the input signal swing becomes larger. The general operation of automatic gain controllers may be known to those skilled in the art. For example, gain control may be performed using simple power detectors, such as underload and overload detectors. The detectors may generate an underload/overload flag or a more continuous value, which is used in a control loop. For example, the gain determination elements may generate current pulses depending on the load situation. Underload pulses may be less frequent or lower magnitude than overload pulses. The current pulses may be used to charge a capacitor and the voltage thereof may provide the gain control signal/control the amplifier gain. It will be appreciated that this is only one example of how the first and second gain determination elements may be implemented and other implementations may be used.

The gain controller 112, 212 can therefore determine an advantageous amplifier gain control signal based on the first and second gain control signals. The gain controller 112, 212 may be configured to select one of the first or second gain control signals from the first or second gain determination elements as the amplifier gain control signal based on predetermined criteria. Thus, the gain determination elements provide "candidate" amplifier gain control signals and the gain controller selects the appropriate candidate. In one example, the criteria comprises the selection of a lower of the gain control signals from the plurality of gain determination elements. In other examples, the gain controller may derive the amplifier gain control signal from a function of the first and second gain control signals. In some examples, the criteria may include predetermined limits on the amplifier gain control signal. For example, the gain controller may modify the gain control signals to adhere to the predetermined limits or may ignore the gain control signals that exceed the predetermined limits, for example. In some examples, the apparatus may be configured to determine the number of times the gain control signal of one of the gain determination elements, such as the first gain control signal, has been selected as the amplifier gain control signal in a predetermined preceding period. If the determined number of times exceeds a threshold, the predetermined criteria may be modified to select the "frequent" gain control signal less or modify it.

The provision of two or more control loops operating at different speeds and working together is advantageous. The description herein is mainly focused on the use of two control loops but it will be appreciated that additional control loops may be provided that are configured to generate gain control signals based on changes in their input signal that occur at frequencies different to the first and second frequencies, such as between the first and second frequencies.

The first and second gain determination elements 106, 206, 107, 207 may be configured, by setting of the first and second frequencies for example, such that under normal operation (without substantial impulse noise) the second gain determination element or "slow control loop" is expected to provide the amplifier gain control signal. On the occurrence of impulse noise or strong, transient blocking signals, the first gain determination element or "fast control loop" may take over and provide the amplifier gain control signal to reduce the gain rapidly. When the noise/disturbing blocking signal disappears, the first gain determination element or "fast control loop" allows for the gain to be reduced to a level determined by the second gain determination element.

The input signal to the one or more gain determination elements 106, 107, 206, 207 may comprise an indication of a power level of the amplifier output signal 105. Accordingly, in this example, the apparatus 100 includes a power level determination element 113, 213 configured to receive the amplifier output signal 105 and generate a power level signal indicative of the power of the amplifier output signal for providing to the gain determination elements 106, 107 as their respective input signal via the splitter 114, 214. In other examples, the input signal to the first and second (and any other) gain determination elements may comprise the amplifier output signal, a normalised version of the amplifier output signal, a measure of the amplitude of the amplifier output signal. In other examples the input signal to the first and second gain determination elements may comprise the amplifier input signal or a signal derived therefore, which may be in combination with the amplifier gain control signal. It will be appreciated that while the first and second gain determination elements are configured to receive a common signal in this example, they may receive different signals, which may make processing for changes at the first and second frequencies easier, for example.

As mentioned above, the first gain control element may provide for adjustment of the gain of the amplifier 102 on occurrence of short term noise such as impulse noise or fast appearing/disappearing blocking signals. However, when such noise disappears, and the first gain determination element effectively hands control back to the second gain determination element (by virtue of the selection criteria of gain controller 112, 212), the second gain determination element may have adjusted its second gain control signal in response to the noise. Thus, the amplifier gain control signal may be inappropriate for the received signal.

In one example, the apparatus 100, 200 may be configured to use a historic amplifier gain control signal, obtained within a predetermined time of a current time, in determination of the amplifier gain control signal. Thus, historic amplifier gain control signal may comprise the gain signal applied just prior to an occurrence of noise. The apparatus 100, 200 or gain controller 112, 212 may include a buffer to store a predetermined number of recent preceding amplifier gain control signals, such as a FIFO buffer. The gain controller 112 may use a historic amplifier gain control signal from the buffer in its criteria for determining the amplifier gain control signal. Alternatively, the apparatus 100, 200 may be configured to store the amplifier gain control signal prior to each time the gain controller "selects" the first gain control element 106, 206 as the amplifier gain control signal. Thus, the apparatus has a record of the gain control signal prior (potentially) to the occurrence of impulse noise. The historical amplifier gain control signal may be obtained at least prior to an abrupt change in the gain control signal comprising a change that exceeds a rate of change threshold. The abrupt change that exceeds the rate of change threshold may be deduced from the "selection" of the gain control signal as first gain control element 106, 206. Alternatively, the buffer may be analysed for rates of change exceeding a threshold.

The gain controller 112, 212 may be configured to detect when the impulse noise or fast appearing/disappearing noise (over timescales of 0.1 µs to 10 or 100 ms) is no longer present. The ceasing of the noise may be determined from the output of the first gain determination element or from the amplifier input or amplifier output signal. The gain controller 112 may then use the historic amplifier gain control signal in accordance with the predetermined criteria for determining the amplifier gain control signal. In one example, the gain controller is configured to "select" the historic amplifier gain control signal as the amplifier gain control signal before incorporating or selecting the second gain control signal. In other examples, the predetermined criteria may use the historic amplifier gain control signal in accordance with the predetermined criteria whether or not impulse noise has been detected starting or finishing.

In this example, the apparatus is configured to use the determined difference between the first gain control signal and the second gain control signal or, more generally, the difference between any two of the plurality of gain control signals.

The difference may be used by the gain controller as part of its predetermined criteria. For example, if the difference >0 (or some dB) the controller may decide to use the faster gain determination element gain control signal value otherwise the slower gain control signal is used.

The difference may be used by one or more of the plurality of gain determination element For example, if the difference >0 this may be interpreted as an overload situation for the slower gain determination element. Further, the faster gain determination element may limit its gain value based on the difference.

Accordingly, the apparatus 100, 200 includes a difference determination element 115, 215. The difference determination element 115, 215 is configured to receive the current first gain control signal from the element 106, 206 and the second gain control signal from the element 107, 207 and determine the difference between them. The difference or a signal indicative thereof may be passed to one or more of the first gain determination element 106, 206, the second gain determination element 107, 207 and the gain controller 112, 212.

In one example, if a strong (and changeable) interference signal is present, the faster first gain determination element 106 and the slower second gain determination element 107 may react similarly. In certain circumstances, the slower second gain determination element may not reduce its second gain control signal as it believes the gain level is acceptable. This leaves the faster first gain determination element providing the amplifier gain control signal. However, if the second gain determination element is provided with an indication of the difference between its second gain control signal and the first gain control signal it can adjust the second gain control signal or "reset" it to a lower value so that it can be selected by the gain controller 112.

The faster first gain determination element may produce a louder output (i.e. a gain control signal of greater magnitude that the second gain control signal) than the slower second gain determination element for the same input signal. This is advantageous as the first gain determination element may require less backoff. It will be appreciated that one can configure the different gain determination elements/feedback loops with different gain thresholds/backoff parameters.

Figure 3:
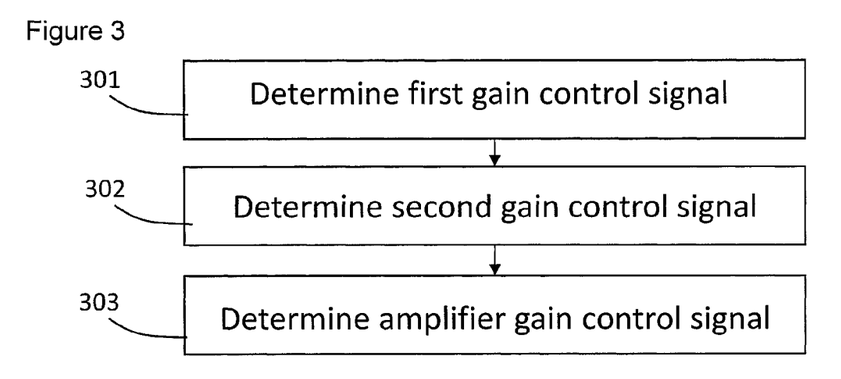
FIG. 3 shows an example method for deriving a gain control signal.

In use, the apparatus 100 may perform the following method, with reference to FIG. 3. Determine (step 301) a first gain control signal from an input signal derived from the amplifier signal based on changes in the input signal. Determine (step 302) a second gain control signal from an input signal derived from the amplifier signal based on changes in the input signal. The determination is performed at a different speed and/or using a different map/function between the input signal and the gain control signal. Determine (step 303) an amplifier gain control signal for providing to an amplifier 102 based on at least the first and second gain control signals. The apparatus/method is advantageous as utilising a plurality of gain determination elements/control loops that operate at different speeds and/or map their input signal to the gain control signal differently is advantageous as gain control can be effectively applied in a wide range of interference/signal reception conditions by actively selecting during use the appropriate gain control signal from each of the elements.

The above description has made reference to FIGS. 1 and 2 and has described the common features thereof. Reference is now made to FIG. 2 to describe the differences between the examples of FIGS. 1 and 2.

The gain control apparatus 200 includes a pattern detection element 216 configured to identify periodic interference in the amplifier signal 103, 203 by determination of a pattern in the time period between interference events. The element 216 is further configured to determine a predicted future interference event using the pattern to enable the apparatus 200 to generate a gain control signal to compensate for the predicted future interference event.

In one example, the pattern detection element 216 may provide a signal to the gain controller 212 such that it may generate the amplifier gain control signal additionally based on periodic interference identified in the amplifier signal 103 or the predicted future interference event.

In this example, the pattern detection element 216 is configured to determine the presence of periodic interference using the first gain control signal and the second gain control signal. The pattern detection element 216, in this example, is configured to provide a signal 217 based on its predicted future interference event to the first gain determination element 206. The signal 217 may be a digital signal. In one example, the signal 217 is used by the gain controller to speed up the first and/or second gain determination element or, more specifically, the gain control loops thereof when the signal 217 is active. Alternatively the signal 217 may force the first and/or second gain determination element to decrease their gain control signal by a certain amount. The signal 217 may comprise a predicted gain value. The predicted gain value which may be used by the gain controller to reduce the amplifier gain control signal.

The pattern detection element 216 may be configured to determine an interference event using the times when the first gain control signal is selected by the gain controller 212; or based on changes in the first gain control signal exceeding a predetermined threshold; or based on the difference between the first and second gain control signals.

Whichever way the interference signals are received whether that be direct or indirectly from the amplifier signal 103, the pattern detection element 216 is configured to use a timer to measure time periods between interference events. An interference event is an occurrence of impulse noise and/or a strong blocking signal and is detectable by any of the means above using appropriately set thresholds. Thus, the pattern detection element 216 is configured to measure the time between consecutive interference events and, in this example, the duration of each event. Once three interference events are detected that have the same period, the element 216 may be configured to provide the signal 217 at a predicted time in the future based on the measured period. The pattern detection element 216 may also store the gain control signal that was applied during the previous interference event such that it can be applied to the amplifier 202 at the time of the predicted future interference event. In a more general example, the pattern detection element may utilise a pattern detection algorithm to determine a pattern and provide a signal 217 to provide for modification of the amplifier control signal to compensate for the predicted pattern.

In addition, the pattern detection element 216 is configured to monitor the amplifier signal 203 (directly or indirectly, via the gain determination elements/gain controller, for example) to determine if the predicted future interference event occurred as expected and/or if the detected pattern has now come to an end. The pattern detection element 216 can therefore cease sending its signal 217 and wait for a further pattern to be detected.

The duration of the interference event may be taken to confirm that the noise is short term (by comparing to a time threshold) and/or to know how long to provide a compensatory signal on a predicted future occurrence. The prediction of future interference events, which are typically caused by co-located transmitters, such as WiFi or LTE transmitters, is advantageous. Further, the determination of predicted future events using information from the feedback loops 206, 207 may also comprise an efficient way of detecting patterns.

Figure 4:
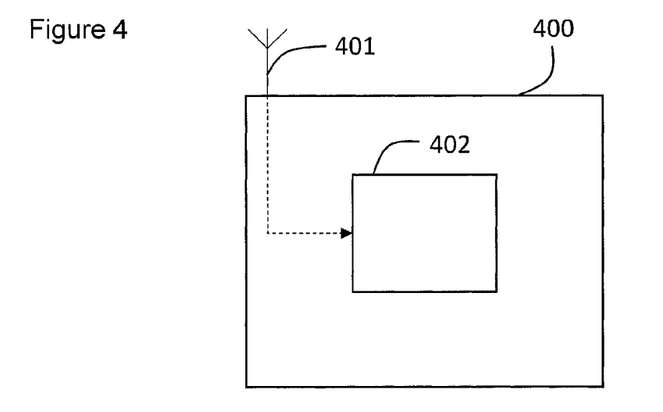
FIG. 4 shows an example electronic device, such as a radio receiver, including an amplifier whose gain is controlled by a gain control apparatus.

FIG. 4 shows a radio receiver 400 including an antenna 401 for receiving an input signal for amplification by the amplifier 402. The gain of the amplifier 402 is provided by the apparatus 100 or 200 described above.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A gain control apparatus for an amplifier, the gain control apparatus configured to provide an amplifier gain control signal for setting the gain applied by the amplifier to an amplifier signal comprising an amplifier input signal amplified by the amplifier to generate an amplifier output signal, the apparatus comprising:
   a plurality of gain determination elements comprising, at least;
      a first gain determination element configured to receive a first input signal derived from the amplifier input signal and to determine a first gain control signal therefrom based on changes in the amplifier input signal; and
      a second gain determination element configured to receive a second input signal derived from the amplifier input signal and to determine a second gain control signal therefrom based on changes in the amplifier input signal; and
      wherein the first gain determination element is configured to react to changes in the amplifier input signal faster than the second gain determination element and/or the first gain determination element is configured to map the change in the amplifier input signal to its first gain control signal differently to the way the second gain determination element maps the change in the amplifier input signal to its second gain control signal;
   a gain controller configured to generate the amplifier gain control signal based on at least the first and second gain control signals;
   in which the gain controller is configured to select one of the gain control signals from the plurality of gain determination elements as the amplifier gain control signal based on predetermined criteria;
   in which the predetermined criteria includes the number of times the gain control signal of one of the gain determination elements has been selected as the amplifier gain control signal in a predetermined preceding period.

2. The gain control apparatus according to claim 1, in which one or more of the gain determination elements are configured to receive, as their input signal, at least one of
   an indication of a power level of the amplifier output signal; and
   an indication of a power level of the amplifier input signal.

3. The gain control apparatus according to claim 1, in which the first and second gain determination elements comprise closed loop feedback elements configured to react to changes in the amplifier input signal at different speeds.

4. The gain control apparatus according to claim 1, in which the criteria comprise selection of a lower of the gain control signals from the plurality of gain determination elements.

5. The gain control apparatus according to claim 1, in which the gain control apparatus is configured to use a historic amplifier gain control signal, obtained within a predetermined time of a current time, in determination of the amplifier gain control signal.

6. The gain control apparatus according to claim 5, in which the gain control apparatus is configured to use the historic amplifier gain control signal in determination of a current amplifier gain control signal, the historical amplifier gain control signal obtained at least prior to an abrupt change in the gain control signal comprising a change that exceeds a rate of change threshold, the historical amplifier gain control signal used in the determination of a current amplifier gain control signal once the amplifier input signal or a signal derived therefrom substantially returns to a value prior to the abrupt change.

7. The gain control apparatus according to claim 1, in which the gain controller is configured to use the difference between the gain control signals of any two gain determination elements in generation of the amplifier gain control signal; and/or one or more of the gain determination elements are configured to receive a signal representative of the difference between the gain control signals of any two of the gain determination elements and use said signal in determining their gain control signal.

8. The gain control apparatus according to claim 1, in which the first gain determination element is configured to map the change in the amplifier input signal to its first gain control signal using a first predetermined function and the second gain determination element is configured to map the change in the amplifier input signal to its second gain control signal using a second predetermined function, the first function different to the second function.

9. The gain control apparatus according to claim 1, in which the gain control apparatus is configured to identify a pattern of interference in the amplifier signal using a pattern detection algorithm applied to interference events and determine a predicted future interference event using the pattern to enable the apparatus to generate an amplifier gain control signal to compensate for the predicted future interference event.

10. The gain control apparatus according to claim 9, in which the gain controller is configured to select one of the gain control signals from the plurality of gain determination elements as the amplifier gain control signal based on predetermined criteria; and the gain control apparatus is configured to determine an interference event using times when the first gain control signal is selected by the gain controller, the gain control apparatus configured to use measured time periods between at least three consecutive selections of the first gain control signal as the amplifier gain control signal and if the selection of the first gain control system is periodic by virtue of the measured periods being substantially equal, the apparatus is configured to use the measured time period and a previous gain control signal determined during one of the previous interference events to determine the amplifier gain control signal.

11. The gain control apparatus according to claim 9, in which the gain control apparatus is configured to use a measured duration of when the first gain control signal is selected to determine a predicted duration of a predicted future interference event and use the duration to determine the amplifier gain control signal.

12. An amplifier arrangement including a controllable amplifier or attenuator and the gain control apparatus according to claim 1, for providing the amplifier gain control signal to the controllable amplifier or attenuator.

13. A radio receiver including an antenna for receiving the amplifier input signal for amplification by the amplifier arrangement of claim 12.

14. A gain control apparatus for an amplifier, the gain control apparatus configured to provide an amplifier gain control signal for setting the gain applied by the amplifier to an amplifier signal comprising an amplifier input signal amplified by the amplifier to generate an amplifier output signal, the apparatus comprising:

a plurality of gain determination elements comprising, at least:

a first gain determination element configured to receive a first input signal derived from the amplifier input signal and to determine a first gain control signal therefrom based on changes in the amplifier input signal; and a second gain determination element configured to receive a second input signal derived from the amplifier input signal and to determine a second gain control signal therefrom based on changes in the amplifier input signal; and wherein the first gain determination element is configured to react to changes in the amplifier input signal faster than the second gain determination element and/or the first gain determination element is configured to map the change in the amplifier input signal to its first gain control signal differently to the way the second gain determination element maps the change in the amplifier input signal to its second gain control signal;

a gain controller configured to generate the amplifier gain control signal based on at least the first and second gain control signals;

in which the gain control apparatus is configured to identify a pattern of interference in the amplifier signal using a pattern detection algorithm applied to interference events and determine a predicted future interference event using the pattern to enable the apparatus to generate an amplifier gain control signal to compensate for the predicted future interference event.

15. The gain control apparatus according to claim 14, in which the first and second gain determination elements comprise closed loop feedback elements configured to react to changes in the amplified input signal at different speeds.

16. The gain control apparatus according to claim 14, in which the first gain determination element is configured to map the change in the amplified input signal to its first gain control signal using a first predetermined function and the second gain determination element is configured to map the change in the amplified input signal to its second gain control signal using a second predetermined function, the first function different to the second function.

17. The gain control apparatus according to claim 14, in which the gain controller is configured to select one of the gain control signals from the plurality of gain determination elements as the amplifier gain control signal based on predetermined criteria; and the gain control apparatus is configured to determine an interference event using times when the first gain control signal is selected by the gain controller, the gain control apparatus configured to use measured time periods between at least three consecutive selections of the first gain control signal as the amplifier gain control signal and if the selection of the first gain control system is periodic by virtue of the measured periods being substantially equal, the apparatus is configured to use the measured time period and a previous gain control signal determined during one of the previous interference events to determine the amplifier gain control signal.

18. The gain control apparatus according to claim 17, in which the gain control apparatus is configured to use a measured duration of when the first gain control signal is selected to determine a predicted duration of a predicted future interference event and use the duration to determine the amplifier gain control signal.

19. An amplifier arrangement including a controllable amplifier or attenuator and the gain control apparatus according to claim 14, for providing the amplifier gain control signal to the controllable amplifier or attenuator.

20. A radio receiver including an antenna for receiving the amplifier input signal for amplification by the amplifier arrangement of claim 19.

\* \* \* \* \*